(12) United States Patent
Lee et al.

(10) Patent No.: US 7,772,762 B2
(45) Date of Patent: Aug. 10, 2010

(54) WHITE LIGHT ORGANIC ELECTROLUMINESCENT ELEMENT

(75) Inventors: Meng-Ting Lee, Taipei (TW); Mei-Rurng Tseng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 484 days.

(21) Appl. No.: 11/856,525

(22) Filed: Sep. 17, 2007

(65) Prior Publication Data

US 2008/0284319 A1     Nov. 20, 2008

(30) Foreign Application Priority Data

May 18, 2007    (TW) .............. 96117758 A

(51) Int. Cl.
*H01J 1/62* (2006.01)
(52) U.S. Cl. .............. 313/504; 313/502; 428/690
(58) Field of Classification Search ......... 313/502, 313/504; 428/690
See application file for complete search history.

(56) References Cited

U.S. PATENT DOCUMENTS

| | | | |
|---|---|---|---|
| 5,683,823 A | 11/1997 | Shi et al. | |
| 6,447,934 B1 * | 9/2002 | Suzuki et al. | 428/690 |
| 6,875,524 B2 * | 4/2005 | Hatwar et al. | 428/690 |
| 7,663,140 B2 * | 2/2010 | Yamazaki et al. | 257/40 |
| 2005/0100760 A1 * | 5/2005 | Yokoyama | 428/690 |
| 2007/0194701 A1 * | 8/2007 | Ito et al. | 313/506 |
| 2008/0067928 A1 * | 3/2008 | Fukuoka et al. | 313/506 |

FOREIGN PATENT DOCUMENTS

| | | | |
|---|---|---|---|
| EP | 1653783 A1 | | 5/2006 |
| WO | WO 2005011333 A1 * | | 2/2005 |

* cited by examiner

*Primary Examiner*—Peter Macchiarolo
(74) *Attorney, Agent, or Firm*—Quintero Law Office

(57) ABSTRACT

A white light organic electroluminescent element is provided. The white organic electroluminescent element comprises an anode, a hole transporting layer on the anode, an orange light emitting layer on the hole transporting layer, a blue light emitting layer on the orange light emitting layer, an electron transporting layer on the blue light emitting layer, and a cathode on the electron transporting layer, wherein the orange light emitting layer is formed by co-evaporation of a host-emitting material, a blue guest-emitting material, and an orange guest-emitting material.

22 Claims, 3 Drawing Sheets

WHITE LIGHT ORGANIC ELECTROLUMINESCENT ELEMENT

BACKGROUND OF THE INVENTION

1. Field of the Invention

The present invention relates to an organic electroluminescent element, and in particular relates to a white light organic electroluminescent element.

2. Description of the Related Art

Recently, with the development and wide application of electronic products, such as mobile phones, PDAs, and notebook computers, there has been increasing demand for flat display elements which consume less electrical power and occupy less space. Among flat panel displays, organic electroluminescent devices are self-emitting, and highly luminous, with wider viewing angle, faster response, and a simple fabrication process, making them the industry display of choice.

Additionally, the organic electroluminescent devices can be used, as not only a light source for liquid crystal displays, but also in the general lighting market. In any case, organic electroluminescent devices have high luminance efficiency and require high operating stability.

As disclosed in U.S. Pat. No. 5,683,823, a white light organic electroluminescent element includes: a anode; a positive-hole transporting layer; a fluorescent emitting layer; an electron transporting layer; and a cathode, wherein the fluorescent emitting layer includes a red light emitting material uniformly dispersed in a blue host emitting material. However, the requirement of a narrow doping concentration range of the red light emitting material in blue host emitting material results in a relatively difficult production process.

As disclosed in European Patent No. 1653783, a white light organic electroluminescent element includes: an anode; a blue emitting layer comprising a blue guest-emitting material doped in a blue host-emitting material; and a yellow/red emitting layer comprising a yellow/red guest-emitting material doped in a blue host-emitting material. However, the energy transfer between the blue host-emitting material and the yellow/red guest-emitting material is not efficient resulting in the reduction of luminance efficiency and stability.

Accordingly, there is a need to develop a white light organic electroluminescent element with high luminance efficiency, high operating stability, and a simple fabrication process.

BRIEF SUMMARY OF THE INVENTION

The invention provides a white light organic electroluminescent element, comprising: an anode; a hole transporting layer on the anode; an orange light emitting layer on the hole transporting layer, wherein the orange light emitting layer is formed by co-evaporation of a host-emitting material, a blue guest-emitting material, and an orange guest-emitting material; a blue light emitting layer on the orange light emitting layer, wherein the blue light emitting layer is formed by co-evaporation of the host-emitting material and the blue guest-emitting material; an electron transporting layer on the blue light emitting layer; and a cathode on the electron transporting layer.

The invention further provides a white light organic electroluminescent element, comprising: an anode; a hole transporting layer on the anode; a blue light emitting layer on the hole transporting layer, wherein the blue light emitting layer is formed by co-evaporation of a host-emitting material and a blue guest-emitting material; an orange light emitting layer on the blue light emitting layer, wherein the orange light emitting layer is formed by co-evaporation of a host-emitting material, a blue guest-emitting material, and an orange guest-emitting material; an electron transporting layer on the blue light emitting layer; and a cathode on the electron transporting layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The organic electroluminescent element of the invention is a white light organic electroluminescent element, and one feature of the invention is use of an orange light emitting layer formed by co-evaporation of a host-emitting material, a blue guest-emitting material, and an orange guest-emitting material. The white light organic electroluminescent element of the invention can improve the energy transfer efficiency of the yellow/red light emitting layer formed by a host-emitting material and a yellow/red guest-emitting material so that the white light organic electroluminescent element has high luminance efficiency and operational stability. The white light organic electroluminescent element of the invention includes at least a substrate, an anode electrode, a cathode electrode, an organic carrier transport layer, and an electroluminescent material layer.

Figure 1:
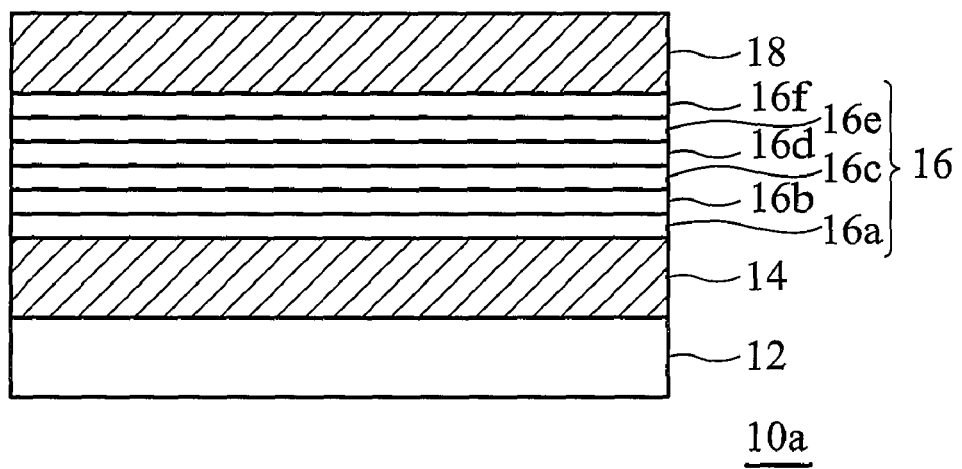
FIG. 1 is a cross section of a white light organic electroluminescent element of the invention.

Referring to FIG. 1, the white light organic electroluminescent element 10a includes a substrate 12, of an insulating material such as glass, plastic, or ceramic. Further, the substrate 12 can be a semiconductor substrate, transparent or optionally opaque, specifically a transparent substrate when the organic electroluminescent device 10 is a dual emission organic electroluminescent device, and an opaque substrate when the organic electroluminescent device 10 is a top-emission organic electroluminescent device.

A first electrode such as an anode electrode 14 is formed on the substrate 12, and can be a transparent electrode, metal electrode, or combinations thereof, comprising indium tin oxide (ITO), indium zinc oxide (IZO), aluminum zinc oxide (AZO), zinc oxide (ZnO), Li, Mg, Ca, Al, Ag, In, Au, Ni, Pt, or alloys thereof, formed by a method such as sputtering, electron beam evaporation, thermal evaporation, or chemical vapor deposition. In an embodiment of the invention, anode electrode 14 can be a non-transparent molybdenum with reflectivity.

A multiple organic layer 16 is formed on the anode electrode 14, wherein the electroluminescent layer 16 at least comprises a hole injection layer 16a, a hole transporting layer 16b, a orange light emitting layer 16c, a blue light emitting layer 16d, an electron transporting layer 16e, and an electron injection layer 16f, as shown in FIG. 1. The multiple organic layers 16 is an organic semiconductor material such as small molecule material, polymer, or organometallic complex, and can be formed by thermal vacuum evaporation, spin coating, dip coating, roll-coating, injection-fill, embossing, stamping, physical vapor deposition, or chemical vapor deposition. In one embodiment, the hole injection layer 16a and hole transporting layer 16b have a hole transport mobility of $10^{-2}$-$10^{-5}$ $cm^2V^{-1}s^{-1}$. The electron transporting layer 16e and electron injection 16f have an electron transport mobility of $10^{-2}$-$10^{-5}$ $cm^2V^{-1}s^{-1}$. It should be noted that the hole injection layer 16a is not necessary.

The orange light emitting layer 16c can be formed by a host-emitting material, a blue guest-emitting material, and an orange guest-emitting material, wherein the host-emitting material has an emission wavelength of 390 to 450 nm, preferably 410 to 440 nm. The blue guest-emitting material has an emission wavelength of 440 to 490 nm, preferably, 450 to 480 nm. The host-emitting material and the blue guest-emitting material can be a derivative of styryl, pyrene, fluorine, or anthracene. The orange guest-emitting material has an emission wavelength of 540-640 nm, preferably 560-600 nm, and can be a derivative of naphthacene or fluoranthene. A weight ratio of the host-emitting material, blue guest-emitting material, and orange guest-emitting material can be 98:1:1 to 80:10:10. In one embodiment, the thickness of the orange emitting layer is about 1 to 50 nm.

The blue emitting layer 16d can be formed by the co-evaporation of a host-emitting material, and a blue guest-emitting material, wherein the host-emitting material has an emission wavelength of 390 to 450 nm, preferably, 410 to 440, and the blue guest-emitting layer material has an emission wavelength of 440 to 490 nm, preferably, 450 to 480 nm. The host-emitting material and the blue guest-emitting layer can be a derivative of styryl, pyrene, fluorene or anthracene. A weight ratio of the host-emitting material and blue guest-emitting material can be about 99.5:0.5, preferably, 90:10. The thickness of the blue emitting layer can be about 3 to 50 nm.

Finally, a second electrode 18 as a cathode is formed on the multiple organic layer 16. The second electrode 18 is a transparent metal electrode, and the transparent metal electrode can be a general metal, such as aluminum, golden, silver, magnesium or calcium.

Compared to the yellow/red light emitting layer formed by a host-emitting material and yellow/red guest-emitting material, the orange light emitting layer 16c has higher energy transfer efficiency to improve the luminance efficiency of the devices. Additionally, the orange light emitting layer 16c and the blue light emitting layer 16d have the same host-emitting material and blue guest-emitting layer resulting in simplicity of the manufacturing process.

Figure 2:
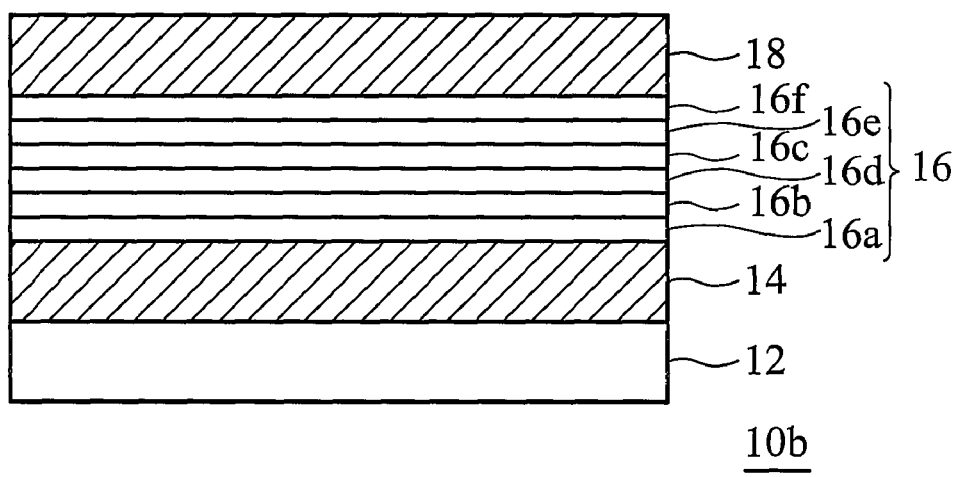
FIG. 2 is a cross section of a white light organic electroluminescent element illustrating an orange light emitting layer disposed on a blue light emitting layer according to an embodiment of the invention.

Referring to FIG. 2, an organic electroluminescent device 10b according to another embodiment of the invention is shown. In this embodiment, an orange light emitting layer 16c can be formed on the blue light emitting layer 16d, with manufacturing steps as discussed previously.

Figure 3:
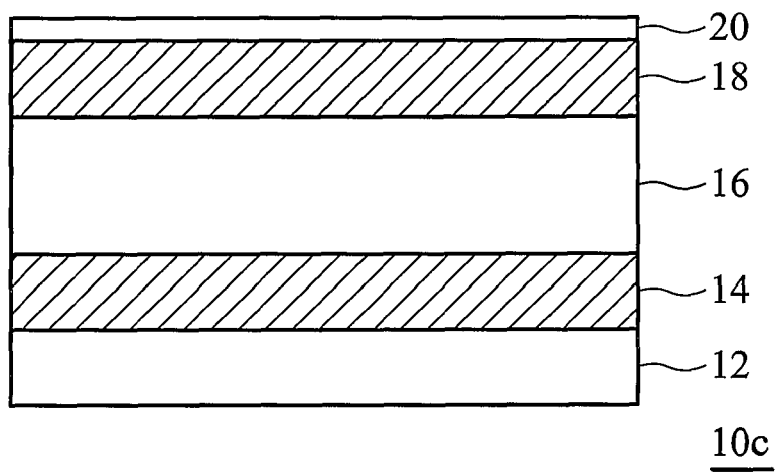
FIG. 3 is a cross section of a white light organic electroluminescent element illustrating a recovery layer disposed on a second electrode according to another embodiment of the invention.

Referring to FIG. 3, an organic electroluminescent device 10c according to a further embodiment of the invention is shown. In this embodiment, the organic electroluminescent device 10c further comprises a light out-coupling layer 20 formed on the second electrode 18, its thickness is between about 15 and 100 nm, preferably, 20 to 60 nm. The light out-coupling layer 20 can be an organic material, such as NPB or Alq3, or a metal oxide, such as $MoO_3$, $SnO_2$, $TeO_2$, $TiO_2$, or $Ta_2O_3$, and its refractive index exceeds 1.5, preferably, exceeds 1.7. The additional light out-coupling layer can improve the transmittance ratio of the electrode.

EXAMPLE

Working Example 1

The white organic electroluminescent device used here was a top-emission organic electroluminescent device. The substrate was a glass substrate. The anode was a Mo reflective metal electrode, which had a thickness of 100 nm. The hole injection layer, hole transporting layer, orange light emitting layer, blue light emitting layer, electron transporting layer, electron injection layer, transparent cathode, and light opt-coupling layer was subsequently formed. The material and thickness of the layers are shown as follows:

The hole injection layer, with a thickness of 20 nm, consisted of $MoO_3$ (Molybdenum trioxide) and NPB (N,N'-di-1-naphthyl-N,N'-diphenyl-1,1'-biphenyl-1,1'-biphenyl-4,4'-diamine), and a weight ratio of $MoO_3$ and NPB was 80:20.

The hole transporting layer, with a thickness of 10 nm, consisted of NPB.

The orange light emitting layer, with a thickness of 6 nm, consisted of 9,10-di(2-napthyl)anthrance (H1), p-bis(p-N,N-diphenyl-aminostyryl)benzene (BD1), and 3,11-diphenylamino-7,14-diphenyl-acenaptho[1,2-k]fluoranthene (RD1), and its doped ratio was 95:4:1.

The blue light emitting layer, with a thickness of 20 nm, consisted of 9,10-di(2-napthyl)anthrance (H1) amd p-bis(p-N,N-diphenyl-aminostyryl)benzene (BD1), and its doped ratio was 96:4.

The electron transporting layer, with a thickness of 10 nm consisted of Bphen.

The electron injection layer, with a thickness of 10 nm, consisted of $Cs_2CO_3$ and Bphen having a doped ratio of 20:80.

The transparent cathode included Al of 1.5 nm and Ag of 17.5 nm.

The light out-coupling layer, with a thickness of 30 nm, consisted of NPB.

The structure of the organic electroluminescent device of the Working Example 1 was: glass/Mo 100 nm/$MoO_3$:NPB 20 nm/NPB 10 nm/H1:BD1:RD1 6 nm/H1:BD1 20 nm/Bphen 10 nm/$Cs_2CO_3$:Bphen 10 nm/Al 1.5 nm/Ag 17.5 nm/NPB 30 nm.

Comparative Example 1

Comparative Example 1 was executed in the same manner as Working Example 1 except that the material of the orange light emitting layer was changed. The orange light emitting layer, with a thickness of 6 nm, consisted of 9,10-di(2-napthyl)anthrance (H1) and 3,11-diphenylamino-7,14-diphenyl-acenaptho[1,2-k]fluoranthene (RD1), and its doped ratio was 99:1.

The structure of the organic electroluminescent device of the Comparative Example was: glass/Mo 100 nm/MoO$_3$: NPB 20 nm/NPB 10 nm/H1:RD1 6 nm/H1:BD1 20 nm/Bphen 10 nm/Cs$_2$CO$_3$: Bphen 10 nm/Al 1.5 nm/Ag 17.5 nm/NPB 30 nm. The properties of the Examples are listed in Table 1. According to Table 1, the white light organic electroluminescent element of the invention has higher current efficiency and intensity than Comparative Example 1 at 3000 cd/m$^2$.

TABLE 1

|  | Voltage (v) | Current efficiency (cd/A) | Power efficiency (lm/W) | CIE | Peak (nm) | FWHM (nm) |
|---|---|---|---|---|---|---|
| Working Example 1 | 5.3 | 4.6 | 2.7 | (0.33, 0.41) | 472 | 152 |
| Comparative Example 1 | 4.9 | 3.7 | 2.3 | (0.33, 0.39) | 472 | 160 |

Figure 4:
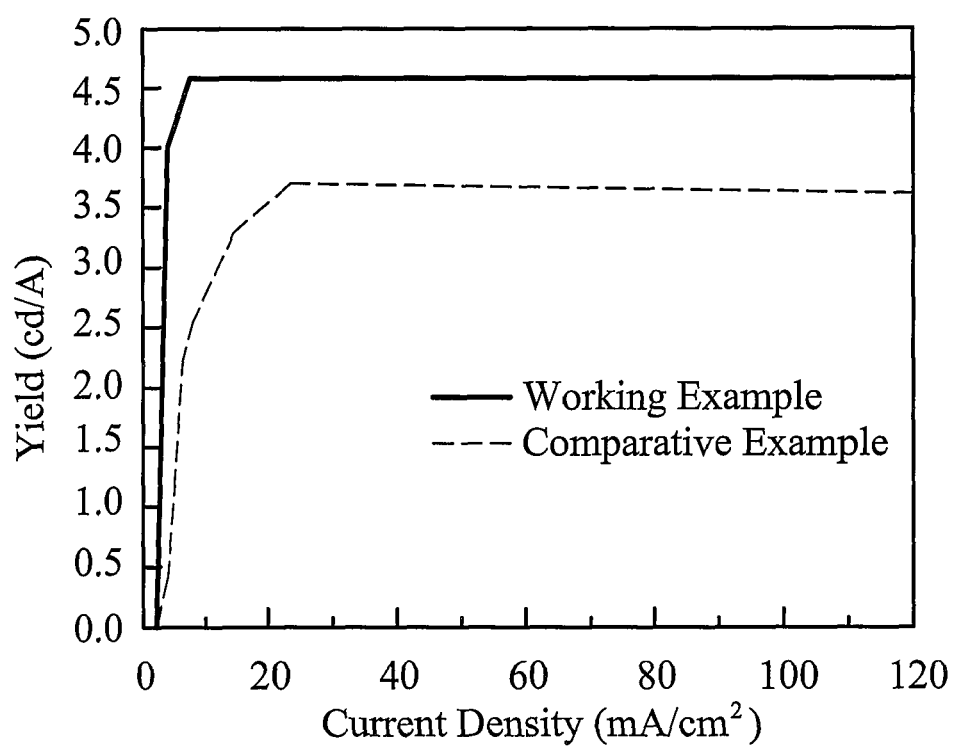
FIG. 4 is a graph plotting current density against current efficiency of the white light organic electroluminescent devices as disclosed in Working Example 1 and Comparative Example 1.

FIG. 4 is a graph plotting current density against current efficiency of the white light organic electroluminescent devices. Referring to FIG. 4, the current efficiency of working Example 1 was 4.6 cd/A, which was 1.3 times than the current efficiency of comparative Example 1.

Figure 5:
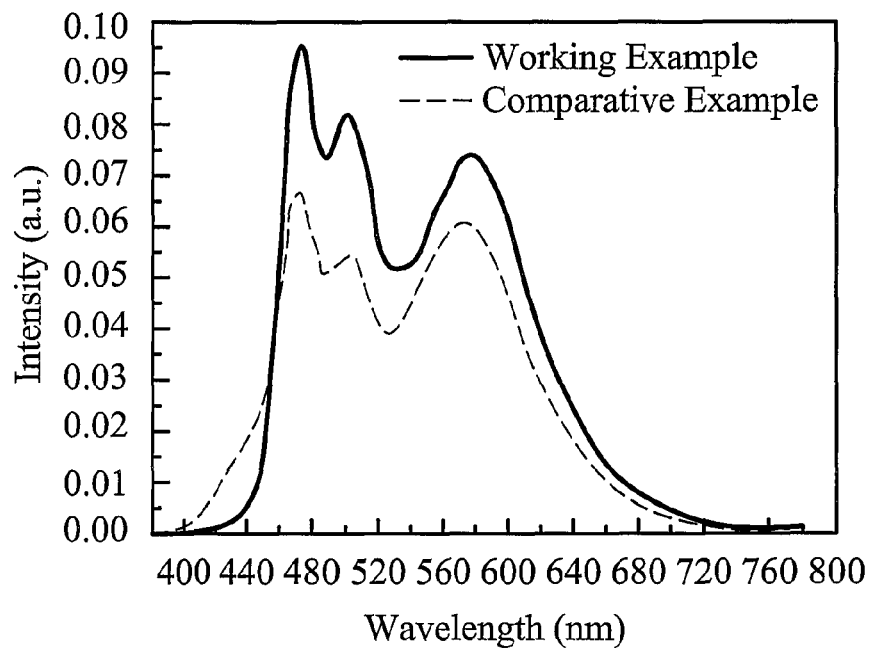
FIG. 5 is a graph plotting luminance intensity against wavelength of the white light organic electroluminescent devices as disclosed in Working Example 1 and Comparative Example 1.

FIG. 5 is a graph plotting luminance intensity against wavelength of the white light organic electroluminescent devices. Referring to FIG. 5, working Example 1 had higher luminance intensity than comparative Example 1, and the host-emitting material of working Example 1 did not produce the surplus emission at 400 to 460 nm, namely, working Example 1 had higher energy transfer efficiency than that of comparative Example 1.

Figure 6:
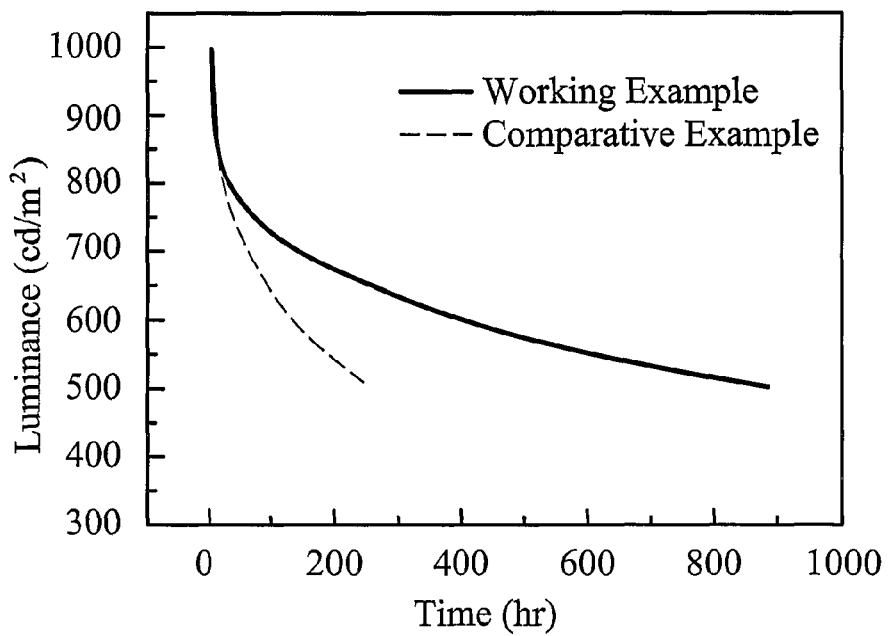
FIG. 6 is a graph plotting operational time against luminance of the white light organic electroluminescent devices as disclosed in Working Example 1 and Comparative Example 1.

FIG. 6 is a graph plotting operational time against luminance of organic electroluminescent devices. Referring to FIG. 6, the working Example 1 had higher operational stability than that of comparative Example 1.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A white light organic electroluminescent element, comprising:
   an anode;
   a hole transporting layer on the anode;
   an orange light emitting layer on the hole transporting layer, wherein the orange light emitting layer is formed by co-evaporation of a host-emitting material, a blue guest-emitting material, and an orange guest-emitting material;
   a blue light emitting layer on the orange light emitting layer, wherein the blue light emitting layer is formed by co-evaporation of the host-emitting material and the blue guest-emitting material;
   an electron transporting layer on the blue light emitting layer; and
   a cathode on the electron transporting layer.

2. The white light organic electroluminescent element as claimed in claim 1, further comprising a hole injection layer disposed between the anode and the hole transporting layer.

3. The white light organic electroluminescent element as claimed in claim 1, further comprising an electron injection layer disposed between the electron transporting layer and the cathode.

4. The white light organic electroluminescent element as claimed in claim 1, wherein the host-emitting material has an emission wavelength of 390 to 450 nm.

5. The white light organic electroluminescent element as claimed in claim 1, wherein the blue guest-emitting material has an emission wavelength of 440 to 490 nm.

6. The white light organic electroluminescent element as claimed in claim 1, wherein the orange guest-emitting material has an emission wavelength of 540 to 640 nm.

7. The white light organic electroluminescent element as claimed in claim 1, wherein the blue light emitting layer has a thickness of 1 to 50 nm.

8. The white light organic electroluminescent element as claimed in claim 1, wherein the orange light emitting layer has a thickness of 3 to 50 nm.

9. The white light organic electroluminescent element as claimed in claim 1, wherein a weight ratio of the host-emitting material, the blue guest-emitting material, and the orange guest-emitting material in the orange light emitting layer is about 98:1:1 to 80:10:10.

10. The white light organic electroluminescent element as claimed in claim 1, wherein a weight ratio of the host-emitting material, the blue guest-emitting material in the blue light emitting layer is about 99.5:0.5 to 90:10.

11. The white light organic electroluminescent element as claimed in claim 1, further comprising a light out-coupling layer disposed on the cathode, and the refractive index of the light out-coupling layer exceeds 1.5.

12. A white light organic electroluminescent element, comprising:
   an anode;
   a hole transporting layer on the anode;
   a blue light emitting layer on the hole transporting layer, wherein the blue light emitting layer is formed by co-evaporation of a host-emitting material and a blue emitting material;
   an orange light emitting layer on the blue light emitting layer, wherein the orange light emitting layer is formed by co-evaporation of the host-emitting material, the blue guest-emitting material, and an orange guest-emitting material;
   an electron transporting layer on the orange light emitting layer; and
   a cathode on the electron transporting layer.

13. The white light organic electroluminescent element as claimed in claim 12, further comprising a hole injection layer disposed between the anode and the hole transporting layer.

14. The white light organic electroluminescent element as claimed in claim 12, further comprising an electron injection layer disposed between the electron transporting layer and the cathode.

15. The white light organic electroluminescent element as claimed in claim 12, wherein the host-emitting material has an emission wavelength of 390 to 450 nm.

16. The white light organic electroluminescent element as claimed in claim 12, wherein the blue guest-emitting layer has an emission wavelength of 440 to 490 nm.

17. The white light organic electroluminescent element as claimed in claim 12, wherein the orange guest-emitting layer has an emission wavelength of 540 to 640 nm.

18. The white light organic electroluminescent element as claimed in claim 12, wherein the blue light emitting layer has a thickness of 1 to 50 nm.

19. The white light organic electroluminescent element as claimed in claim 12, wherein the orange light emitting layer has a thickness of 3 to 50 nm.

20. The white light organic electroluminescent element as claimed in claim 12, wherein a weight ratio of the host-emitting material, the blue guest-emitting material, and the orange guest-emitting material in the orange light emitting layer is about 98:1:1 to 80:10:10.

21. The white light organic electroluminescent element as claimed in claim 12, wherein a weight ratio of the host-emitting material and the blue guest-emitting material in the blue light emitting layer is about 99.5:0.5 to 90:10.

22. The white light organic electroluminescent element as claimed in claim 12, further comprising a light out-coupling layer disposed on the cathode, and the refractive index of the light out-coupling layer exceeds 1.5.

* * * * *